United States Patent [19]
Duckworth

[11] 4,039,932
[45] Aug. 2, 1977

[54] FAULT INDICATOR TESTING APPARATUS

[75] Inventor: William H. Duckworth, San Diego, Calif.

[73] Assignee: San Diego Gas & Electric Co., San Diego, Calif.

[21] Appl. No.: 661,711

[22] Filed: Feb. 26, 1976

[51] Int. Cl.² ............................................ G01R 31/02
[52] U.S. Cl. .................................... 324/28 R; 340/410
[58] Field of Search ................. 324/28 R, 28 CB, 54; 340/214, 410; 179/175.23

[56] References Cited

U.S. PATENT DOCUMENTS

| | | | |
|---|---|---|---|
| 3,321,702 | 5/1967 | Tuccinardi | 324/28 RS |
| 3,373,350 | 3/1968 | Reece | 324/28 R |
| 3,495,174 | 2/1970 | Marek | 324/28 R |

Primary Examiner—Rudolph V. Rolinec
Assistant Examiner—Michael J. Tokar
Attorney, Agent, or Firm—Christie, Parker & Hale

[57] ABSTRACT

Apparatus provides for testing a fault indicator of the type which has a surge-current detection portion and a settable fault indicating portion and which is widely used in electric power distribution systems. Such a fault indicator must meet certain performance specifications including a maximum allowable reaction-time specification relating to the time required for the detection portion first to detect a surge current flowing in a conductor as a result of a down-line fault and then to set the fault indicating portion accordingly. The testing apparatus of this invention provides for effectively simulating field conditions, and to this end includes current-drive circuitry for supplying a test surge current to the fault indicator under test. Substantially simultaneously with the start of the test surge current, a timing-initiation signal is produced to enable interval-timing circuitry in the testing apparatus. To designate the end of the interval being timed, there is produced a timing-completion signal. Preferably, an optical sensing arrangement responsive to the fault indicator provides the timing-completion signal. The testing apparatus includes a display responsive to the interval-timing circuitry to show test result data as to the reaction time of the fault indicator under test.

6 Claims, 3 Drawing Figures

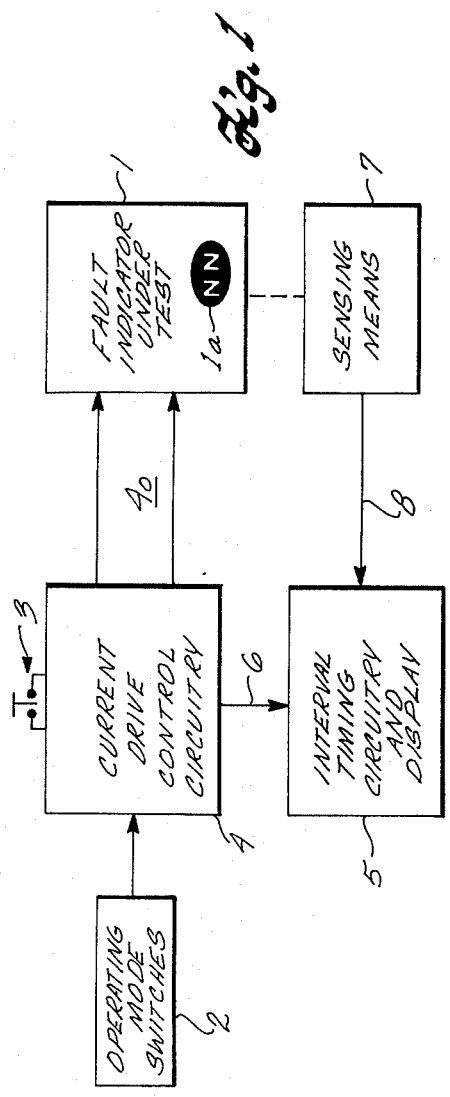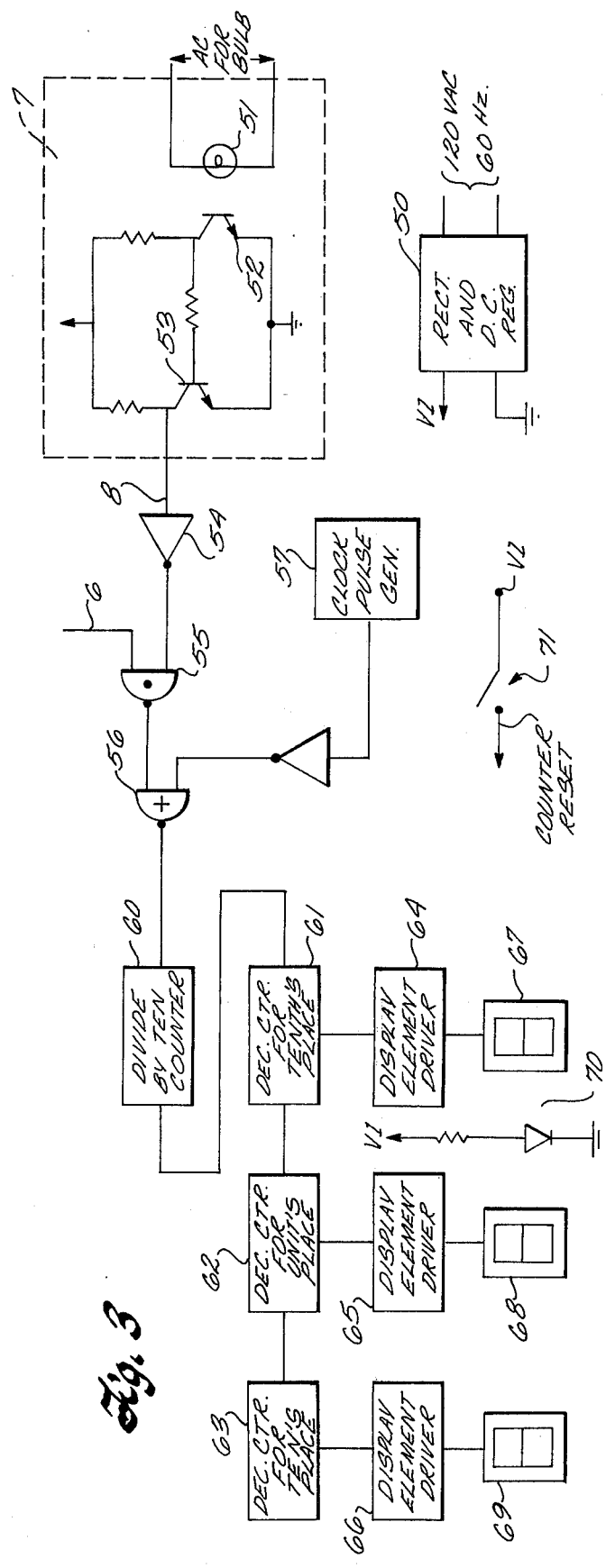

FAULT INDICATOR TESTING APPARATUS

BACKGROUND OF THE INVENTION

This invention relates to apparatus for testing a fault indicator of the type which has surge-current detection means and settable fault indicating means.

The fault indicators tested by the apparatus of this invention are widely used in electric power distribution systems. In the event of a power line fault in the system, maintenance personnel have to track down where the fault occurred. Fault indicators are intended to facilitate this task.

In a typical system, each of a plurality of power transmission lines has serially connected to it a separate fault indicator. If a short circuit occurs somewhere in a line, a surge current results and the detection means of the fault indicator in that line senses this surge current and in response sets the fault indicating means of the fault indicator accordingly. A customary fault indicating means comprises a circular display face showing at least one white letter "N" (for Normal) against a dark background. It also includes a rotatable flag assembly that rotates incident to fault detection so as to cover the letter "N" and to provide a display of a dark letter "F" (for Fault) against a white background. In tracing the system to locate a fault, the maintenance personnel check the fault indicators one-by-one to see which one has been set to indicate a down-line fault.

It has been found that commercial fault indicators are not fully reliable. One problem is that, when a short circuit develops, sometimes a fuse blows or a circuit breaker trips before the fault indicator responds. Thus, the current, although having peaked, drops to zero before the fault indicator has had time to register the down-line fault. This can lead to considerable confusion because the maintenance personnel will inspect the fault indicator and find that it hasn't registered a fault and then will be misled into looking elsewhere to trace out the fault. In view of this problem, there is a real need for equipment that maintenance personnel can use either in a central repair facility or on site for advance checking of whether the fault indicators will work effectively when needed.

In the past, manually controlled testing techniques have been used for testing fault indicators. According to the conventional approach a variac is connected to the fault indicator under test and the variac is manually adjusted until a very high current flows through the fault indicator. With this technique certain operational parameters of a static nature can be determined. In particular, a determination can be made of the magnitude of the sensed current necessary to trip the fault indicator so that it indicates a fault. This checking technique as to static operational parameters does not adequately simulate actual field conditions. That is, it does not simulate the pulse nature of the peak currents that occur incident to a real fault. Thus a too slowing reacting fault indicator can pass this test and yet not operate effectively in the field.

SUMMARY OF THE INVENTION

This invention is directed to apparatus for testing fault indicators of the type including surge-current detection means and settable fault indicating means with the detection means being adapted to set the fault the indicating means when a conductor connected to the fault indicator has flowing through it, for a time lasting longer than the reaction time of the fault indicator, a surge current having a magnitude exceeding a threshold value. A particularly advantageous feature of the testing apparatus of this invention resides in its ability to test this reaction time.

The testing apparatus comprises switching means for actuating a pulse testing operation. Current-drive means in the testing apparatus has an actuation input coupled to the switching means and has a current-dirve output for connection to the conductor to supply thereto during the pulse testing operation a test surge current having a magnitude exceeding the threshold value. Interval-timing circuit means in the testing apparatus has a first circuit input for receiving a timing-initiation signal, a second circuit input for receiving a timing-completion signal, a circuit output, and means for producing on said circuit output an elapsed-time signal representative of the length of time elapsing between sequentially received timing-initiation and timing-completion signals. Timer-control means in the testing apparatus control the interval-timing circuit means so that the elapsed-time signal represents the reaction time of the fault indicator under test. The timer-control means includes circuit means for supplying the timing-initiation signal to said first circuit input substantially simultaneously with the start of the test surge current and further includes sensing means responsive to the fault indicator under test for supplying the timing-completion signal. Test-result display means in the testing apparatus is responsive to the elapsed-time signal and visually indicates the reaction time of the fault indicator under test.

Preferably, the current drive means includes a variac providing an idle-level drive voltage and a pulse-level drive voltage on separately selectable coupling lines. A line switching arrangement is controlled to select one or the other of these coupling lines to provide a path to the current drive output. To control this line switching arrangement, there is included in the preferred embodiment an adjustable delay circuit. More particularly, in the preferred embodiment, the actuation input of the current drive means is provided by the adjustable delay circuit. When a pulse testing operation is actuated by the switching means, the adjustable delay circuit controls the line switching arrangement so that, during a selected portion of a half-cycle of the alternating line voltage, a path is provided between the pulse level drive voltage line and the current drive output of the testing apparatus.

Another preferred feature resides in a digital arrangement of the interval-timing circuitry whereby a precise numerical display of reaction time may be achieved.

BRIEF DESCRIPTION OF THE DRAWINGS

FIG. 1 is a block diagram depicting the overall organization of apparatus according to this invention, and showing a fault indicator connected to the apparatus for testing thereby;

FIG. 3 is a block and schematic diagram showing the preferred arrangement of the interval-timing circuitry and display of FIG. 1.

DETAILED DESCRIPTION

Figure 2:
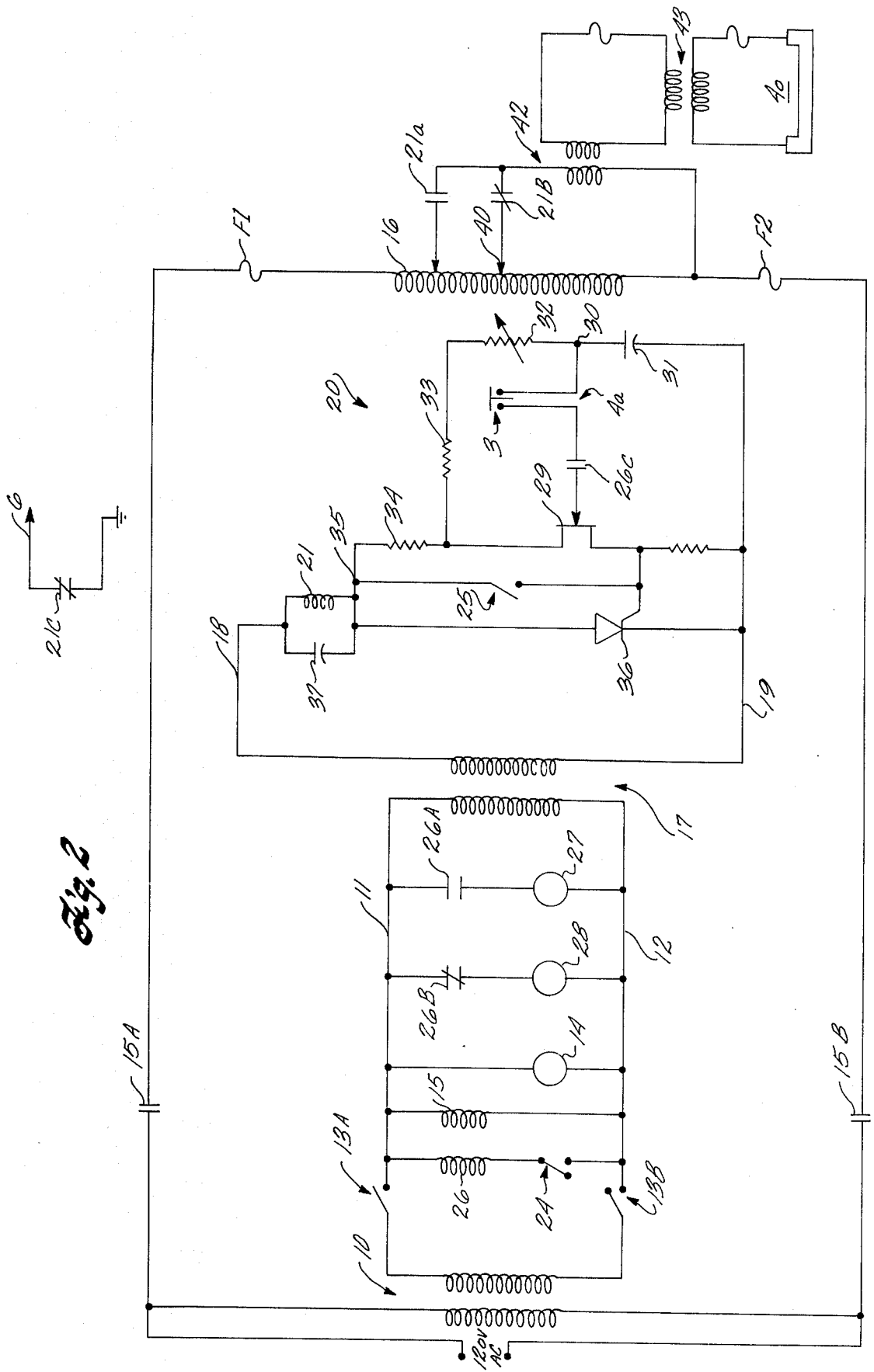
FIG. 2 is a schematic diagram showing the preferred arrangement of the operating mode switches and current-drive control circuitry of FIG. 1.

In FIG. 1, there is shown a fault indicator 1 which is undergoing testing by apparatus organized according to this invention. The block depiction of fault indicator 1 includes a showing of its display element 1a. As shown, display element 1a has a circular face on which there appears two white letters against a dark background. As indicated above, the white letter "N" is conventionally used in a fault indicator display to indicate a normal condition in contrast to a fault condition. A rotatable flag assembly (not shown) is provided in the fault indicator. When the fault indicator registers a down-line fault, the flag assembly rotates to cover the white letters and in their place there is displayed a dark letter "F" against a white background.

The inventive features of this testing apparatus are electrical in nature and therefore such ancillary matters as the housing for the testing apparatus are not dealt with in detail herein. Instead, the only general comment bearing mention here is that the housing preferably includes a front panel for supporting various switches and display lights more particularly described hereinafter.

These switches include operating mode switches shown generally at 2 and a pulse-test actuation switch 3. Briefly, operating mode switches 2 provide for various control functions such as turning the testing apparatus on and off, and such as selecting between static parameter testing and dynamic parameter testing. More particularly, it has been found desirable to conduct a preliminary static parameter test referred to herein as a trip level test operation. The object of this preliminary test is to determine what drive current level, for whatever length of time, is required to cause fault indicator 1 to register a fault by rotating the flag assembly. In contrast, the object of a test referred to herein as a pulse testing operation is to determine how much time is consumed from when a fault-level surge current commences until the fault indicator registers a fault.

For supplying the test surge current, there is provided current-drive control circuitry 4, the preferred arrangement of which is shown in detail in FIG. 2. Control circuitry 4 has an actuation input 4a (FIG. 2), and a current-drive output 4o for connection to a conductor serially connected with and monitored by fault indicator 1.

As will be explained more fully below, a pulse testing operation is actuated by manually closing pulse-test actuation switch 3 while operating mode switches 2 are set to pulse mode position. Substantially simultaneously with the start of the test surge current supplied at output 4o, control circuitry 4 provides a timing-initiation signal to interval-timing circuitry and display 5.

The details regarding the construction and operation of the preferred embodiment of the interval-timing circuitry are more fully described below with reference to FIG. 3. Briefly, the interval-timing circuitry has a first circuit input which is connected by a signal lead 6 to control circuitry 4 to receive the timing-initiation signal therefrom, and a second circuit input for receiving a timing-completion signal. During the length of time elapsing between sequentially received timing-initiation and timing-completion signals, the interval-timing circuitry generates an elapsed-time signal, and this signal is displayed, thereby visually indicating the test results as to the reaction time of fault indicator 1.

Sensing means 7 cooperates with a portion of control circuitry 4 to form a timer-control means. The details regarding the construction and operation of the preferred embodiment of sensing means 7 are more fully described below with reference to FIG. 3. Briefly, sensing means 7 is responsive to fault indicator 1 to provide the timing-completion signal on a signal lead 8 connecting sensing means 7 to the second circuit input of the interval-timing circuitry.

Consider now FIG. 2. A transformer 10 has its primary winding connected to an a.c. power source supplying 120 VAC, 60 Hz. The opposite end terminals of its secondary winding are switchably connected to signal leads 11 and 12 through ganged power-on switches 13A and 13B. An operating-mode display light 14 is connected between signal leads 11 and 12, and lights when power is turned on by closing the ganged switches.

A relay coil 15 is connected between signal leads 11 and 12, and is energized when the ganged turn-on switches are closed. With relay coil 15 being energized, two sets of normally open switching contacts 15A and 15B cause 120 VAC to be impressed upon a variac 16. A pair of safety fuses F1 and F2 are connected in series with variac 16.

A transformer 17 has its primary winding connected between signal leads 11 and 12. In a specific embodiment, the above-described transformers have an overall turns ratio such that 12.6 VAC is defined between signal leads 18 and 19, which are connected to opposite end terminals of the secondary winding of transformer 17.

An adjustable delay circuit, generally indicated at 20, is connected between signal leads 18 and 19. One of the functions of adjustable delay circuit 20 is to control a line switching arrangement comprising a normally open set of relay contacts 21A and a normally closed set of relay contacts 21B. To this end, adjustable delay circuit selectively energizes a relay coil 21.

Under the control of adjustable delay circuit 20, the line switching arrangement selectively provides one of two current flow paths depending upon whether an idle-level drive output or a pulse-level drive output is to be provided.

Another function of adjustable delay circuit 20 is to produce the timing-initiation signal substantially simultaneously with the start of the test surge current during a pulse testing operation. To this end, there is provided a normally closed set of relay switching contacts 21C that are connected to the first circuit input of the interval-timing circuitry.

If a pulse-level drive output is to be provided, certain operating mode switches are positioned as follows. First of all, ganged switches 13A and 13B are closed to provide operating power. Separately, an idle/pulse select switch 24 is closed. Another operating mode switch referred to herein as trip-level test initiate switch 25 is left in its normally open position. Under these conditions, idle/pulse select switch 24 completes a current flow path causing a relay coil 26 to be energized. A normally open set of relay contacts 26A close when relay coil 26 is energized, and in response a display light 27 provides an operating-mode indication showing that the testing apparatus is in condition to perform a pulse testing operation. Simultaneously, a normally closed set of relay contacts 26B open. This turns off a display light 28. While on, display light 28 provides an operating-mode indication showing that the testing apparatus is in condition to perform a trip-level testing operation.

A third set of relay switching contacts 26C are also associated with relay coil 26. Switching contacts 26C are a circuit element of adjustable delay circuit 20 and are connected between the gate electrode of a unijunction transistor 29 and actuation input 4a. When switching contacts 26C close as a result of the energization of relay coil 26, a signal flow path can be completed between the unijunction transistor gate electrode and a terminal 30 by closing actuation switch 3.

With this signal flow path being completed, unijunction transistor 29 fires when the voltage across a capacitor 31 equals the firing voltage of the unijunction transistor. Capacitor 31 is part of an R-C timing network comprising adjustable resistor 32, and resistors 33 and 34, these resistors being connected in series between terminal 30 and a terminal 35. When unijunction transistor 29 fires, it supplies a turn-on pulse to the gate electrode of a silicon controlled rectifier (SCR) 36. The anode of SCR 36 is connected to terminal 35 and its cathode is connected to signal lead 19.

Consider now the waveforms defined by various signals produced during operation of adjustable delay circuit 20. As to the waveform of the voltage on signal lead 18 relative to that on signal lead 19, it is sinusoidal and thus has a positive half-cycle and a negative half-cycle. During an initial, pre-firing portion of the positive half-cycle, capacitor 31 is charged so that the voltage at terminal 31 is positive relative to the voltage on signal lead 19. When the capacitor voltage reaches the firing voltage, unijunction transistor turns on, and as a result SCR 36 is triggered on. Once it is so turned on, SCR 36 continues to conduct throughout the remaining portion of the positive half-cycle, and then turns off incident to the polarity reversal. During the time that SCR conducts, capacitor 31 is discharged.

The following component values have been used for an adjustable delay circuit that provides for energizing relay 21 during the last 4 milliseconds of the positive half-cycle: resistor 34, 3.3K; resistor 33, 10K potentiometer; and capacitor 31, 0.1 μf. In this specific circuit, a capacitor 37 connected in parallel with a relay coil 21 had a value of 100 μf.

It will be appreciated that the above-mentioned 4 ms. interval constitutes 24% of the period of a single cycle of 60 Hz line voltage. This should be compared with a typical specification for reaction time of a fault indicator. In particular, it is customary for such a specification to require a fault indicator to register a fault if surge current last longer than 20% of the period of a single cycle.

In summary of the foregoing, the adjustable delay circuit, while operating in the course of the pulse test operation, postpones the instant at which relay coil 21 is energized for an initial portion of the cycle. In contrast, in the course of the trip level test in which reaction time per se is not considered, relay coil 21 can be energized immediately. In this connection, it should be noted that closing switch 25 provides for triggering SCR 36 substantially immediately after the start of the positive half-cycle.

Consider now in more detail the current drive output. Variac 16 provides an idle-level drive voltage at tap 40, and a pulse level drive voltage at tap 41. While relay coil 21 is de-energized, switching contacts 21B are closed and the idle-level drive voltage is impressed across the primary of a transformer 42. The secondary of transformer 42 in turn drives a transformer 43 the secondary of which is capable of supplying up to 1200 amps at 1 volt. At the time relay coil 21 is energized, switching contacts 21B open and switching contacts 21A close. Accordingly, the pulse-level drive voltage is impressed across the primary of transformer 42. This results in a test surge current flow in the output circuit.

Consider now FIG. 3 which shows among other things a number of logic circuits. To supply d.c. operating power for these logic circuits, there is provided a rectifier and d.c. regulator 50. In a specific embodiment, regulator 50 provides +5V on signal lead V1.

According to a significant preferred feature, an optical sensing arrangement is employed in sensing means 7. In particular, light provided from a light bulb 51 shines on the display face 1a and is reflected toward a photo-darlington transistor stage 52. A suitable photo-darlington transistor stage is commercially available under the designation HEP P1001. When the light reflects from a white "N" onto transistor stage 52, it turns off whereby a transistor 53 is biased on. At the instant that the flag assembly rotates to cover the white N, significantly less light is reflected onto transistor stage 52, thereby turning it on. In view of the foregoing, it will be appreciated that the voltage level appearing on signal lead 8 is at or near 0 volts while an "N" or normal display is presented, and this voltage level changes positively to be at or near +5 volts at the time fault indicator 1 registers a fault.

The logic circuits depicted in FIG. 3 operate in accordance with the positive-logic convention; that is, the +5 volt level equals logical 1 and the 0 volt level equals logical 0.

An inverter 54 has its input connected to signal lead 8 and its output connected to one input of a two-input NAND gate 55. The other input of NAND gate 55 is connected to signal lead 6. The output of NAND gate 55 is connected to one input of a NOR gate 56 which has its other input connected to receive inverted clock pulses. A conventionally arranged clock pulse generator 57 generates clock pulses which in a specific embodiment occur at a 100,000 pps rate.

Consider now the response of the foregoing logic circuits to sequentially received timing-initiation and timing-completion signals. During the initial portion of a pulse test operation, switching contacts 21C are in closed position. Thus, signal lead 6 is connected to 0 volts (a logical 0), and NAND gate 55 accordingly supplies a logical 1 to NOR gate 56. With one of its inputs being maintained at the logical 1 level, NOR gate 56 maintains its output at the logical 0 level even though its other input is receiving pulses.

Substantially simultaneously with the start of the test surge current, switching contacts 21C open. When this occurs, signal lead 6 is disconnected from 0 volts thereby allowing the voltage level thereon to define a logical 1. This change from 0 to 1 designates the start of the interval during which the interval-timing circuitry produces the elapsed-time signal.

At the time of this 0 to 1 change, the output of inverter 54 equals 1 inasmuch as the fault indicator under test will not yet have been presented with the test surge current. With both of its inputs being equal to 1, NAND gate 55 produces a 0. Under these circumstances, the output of NOR gate 56 is controlled by the pulses presented to it on its other input, and thus NOR gate 56 provides a train of clock pulses to a divide-by-10 counter 60. This input clock pulse train has a 100,000 pps frequency, and counter 60 provides a 10,000 pps frequency output pulse train.

If fault indicator 1 is operating properly, it will register a fault within a short time after the timing-initiation signal. Sensing means 7 will respond, and cause the logic level on signal lead 8 to change from 0 to 1. This change from 0 to 1 designates the end of the interval being measured. As a result of this change, the output of NAND gate 55 will return to 1 and no further clock pulses will be gated to counter 60.

The output of counter 60 is supplied to three tandemly connected decade counters 61, 62, and 63. These counters accumulate a count of the number of pulses supplied by counter 60. A suitable integrated circuit decade counter is sold under the designation SN7490. Each decade counter is connected through a respective display element driver (64, 65, and 66) to a seven segment incandescent display element (67, 68, and 69). A suitable driver is sold under the designation SN7447, and a suitable display element is sold under the designation DR-2002. An LED circuit 70 is used to give a display of a decimal point. In view of the foregoing, it will be appreciated that for an exemplary circumstance in which the reaction time of fault indicator 1 is 3.8 milliseconds, the elapsed-time signal will be produced and displayed as follows. First of all, NOR gate 56 will gate 380 pulses to counter 60 during the interval between the sequentially received timing-initiation and timing-completion signals. In response, counter 60 will provide 38 pulses to the tandemly connected decade counters. In response, the tandemly connected decade counters will accumulate a count such that counter 63 will register 0, counter 62 will register 3, and counter 61 will register 8. Thus, 0.38 will be displayed by the test result display elements 69, 68, 67.

At the end of this test, a reset switch 71 is manually closed to provide a reset signal to each of the counters.

I claim:

1. Apparatus for testing the reaction time of a fault indicator which has surge-current detection means and settable fault indicating means, with the surge-current detection means being adapted to set the fault indicating means when a conductor connected to the fault indicator has flowing through it for a time lasting longer than said reaction time a surge current having a magnitude exceeding a threshold value, the testing apparatus comprising:
   switching means for actuating a pulse testing operation;
   current-drive circuit means having an actuation input coupled to the switching means and having a current-drive output for connection to the conductor to supply thereto during the pulse testing operation a test surge current having a magnitude exceeding the threshold value;
   interval-timing circuit means having a first circuit input for receiving a timing-initiation signal, a second circuit input for receiving a timing-completion signal, a circuit output, and means for producing on said circuit output an elapsed-time signal representative of the length of time elapsing between sequentially received timing-initiation and timing-completion signals;
   timer-control means for controlling the interval-timing circuit means so that the elapsed-time signal represents the reaction time of the fault indicator, the timer-control means including circuit means for supplying the timing-initiation signal to said first circuit input substantially simultaneously with the start of the test surge current, and further including sensing means responsive to the fault indicating means of the fault indicator for supplying the timing-completion signal to said second circuit input; and
   test result display means responsive to the elapsed-time signal for visually indicating the reaction time to the fault indicator.

2. The testing apparatus of claim 1 wherein the current-drive circuit means includes: a variac providing an idle-level drive voltage and a pulse-level drive voltage on separately selectable coupling lines; and line switching means for selectively providing a current-drive flow path from one or the other of these lines to the current-drive output.

3. The testing apparatus of claim 2 wherein the line switching means comprises a controllable line switching arrangement, and wherein the current drive circuit means includes an adjustable delay circuit for controlling the line switching arrangement such that during a selected portion of a half-cycle of alternating line voltage, the current-drive flow path is provided between the pulse-level voltage and the current-drive output.

4. The testing apparatus of claim 3 wherein the adjustable delay circuit defines the actuation input which is coupled to the switching means, the adjustable delay circuit including a relay, and circuit means for energizing the coil of the relay, the relay including a set of switching contacts for providing the timing-initiation signal.

5. The testing apparatus of claim 1 wherein the sensing means includes electro-optical means for producing the timing-completion signal when the fault indicating means of the fault indicator under test is set.

6. The apparatus of claim 1 wherein the interval-timing means comprises a clock pulse generator, counting circuit means, and gating circuit means responsive to the sequentially received timing-initiation and timing-completion signals to gate clock pulses to the counting means during the interval elapsing between such sequential receipt.

* * * * *

UNITED STATES PATENT AND TRADEMARK OFFICE
CERTIFICATE OF CORRECTION

PATENT NO. : 4,039,932
DATED : August 2, 1977
INVENTOR(S) : WILLIAM H. DUCKWORTH It is certified that error appears in the above-identified patent and that said Letters Patent are hereby corrected as shown below:

Column 2, line 9, "current-dirve" should read -- current-drive --. Column 4, line 51, "Undet" should read -- Under --. Column 5, line 44, "last" should read -- lasts --. Column 7, line 27, "0.38" should read -- 03.8 --; line 28, after "68," insert -- and --. Column 8, line 18, "to" should read -- of --.

Signed and Sealed this

Fifteenth Day of November 1977

[SEAL]

Attest:

RUTH C. MASON
Attesting Officer

LUTRELLE F. PARKER
Acting Commissioner of Patents and Trademarks